US008032848B2

(12) United States Patent
Moon (10) Patent No.: US 8,032,848 B2
(45) Date of Patent: Oct. 4, 2011

(54) PERFORMING ABSTRACTION-REFINEMENT USING A LOWER-BOUND-DISTANCE TO VERIFY THE FUNCTIONALITY OF A CIRCUIT DESIGN

(75) Inventor: In-Ho Moon, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 315 days.

(21) Appl. No.: 12/362,084

(22) Filed: Jan. 29, 2009

(65) Prior Publication Data

US 2010/0192114 A1 Jul. 29, 2010

(51) Int. Cl.
*G06F 17/50* (2006.01)
(52) U.S. Cl. ............................. 716/106; 716/101; 703/4
(58) Field of Classification Search ................. 716/101, 716/106; 703/4
See application file for complete search history.

(56) References Cited

U.S. PATENT DOCUMENTS

| 6,848,088 | B1 * | 1/2005 | Levitt et al. .................. 716/106 |
| 7,290,230 | B2 * | 10/2007 | Prasad ........................... 716/106 |
| 2002/0178423 | A1 * | 11/2002 | Ben-David et al. .............. 716/4 |
| 2004/0123254 | A1 * | 6/2004 | Geist et al. ....................... 716/4 |
| 2006/0129959 | A1 | 6/2006 | Mang |
| 2006/0212837 | A1 | 9/2006 | Prasad |
| 2009/0007038 | A1 * | 1/2009 | Wang et al. ....................... 716/5 |

OTHER PUBLICATIONS

Gisli, R. et al., "Properties of Embedding Methods for Similarity Searching in Metric Spaces", IEEE Transactions of Pattern Analysis and Machine Intelligence, Apr. 2003, vol. 25, No. 4, pp. 1-20.
Bjesse, Per et al., "Using Counter Example Guided Abstraction Refinement to Find Complex Bugs", In: Design, Automation and Test in Europe Conference and Exhibition, Feb. 2004, vol. 1, pp. 156-161.
Satyaki, Das et al., "Counter-Example Based Predicate Discovery in Predicate Abstraction", Formal Methods in Computer-Aided Design, Nov. 2002, Sec. 1 Introduction.
Burch, J.R., et al., "Symbolic Model Checking for Sequential Circuit Verification", School of Computer Science Carnegie Mellon University, IEEE Transactions on Computer-Aided Design of Integrated Circuits and Systems, pp. 12-16.
Bjesse, P. et al., "SAT-based Verification without State Space Traversal", W.A. Hunt Jr. and S.D. Johnson, editors, Formal Methods in Computer Aided Design, pp. 372-389, Spinger-Verlag, Nov. 2000. LNCS 1954.
McMillan, K. et al., "Interploration and SAT-based Model Checking", International Computer Aided Veri-cation Conference (CAV'03), pp. 1-13, Springer-Verlag, Jul. 2000, LNCS 2725.
Biere, A. et al., "Symbolic Model Checking without BDDs", School of Computer Science Carnegie Mellon University, Jan. 4, 1999, CMU-CS-99-101.

* cited by examiner

*Primary Examiner* — Naum Levin
(74) *Attorney, Agent, or Firm* — Park, Vaughan, Fleming & Dowler LLP; Laxman Sahasrabuddhe (57) ABSTRACT

Embodiments of the present invention provide methods and apparatuses for verifying the functionality of a circuit. The system can determine a lower-bound-distance (LBD) value, such that the LBD value is associated with an LBD abstract model of the CUV which does not satisfy a property. The system can use an abstraction-refinement technique to determine whether the CUV satisfies the property. The system can determine an upper-bound-distance value for an abstract model which is being used in the abstraction-refinement technique, and can determine whether the LBD value is greater than or equal to the upper-bound-distance value. If so, the system can conclude that the abstract model does not satisfy the property, and hence, the system can decide not to perform reachability analysis on the abstract model that is currently being used in the abstraction-refinement technique.

18 Claims, 8 Drawing Sheets

PERFORMING ABSTRACTION-REFINEMENT USING A LOWER-BOUND-DISTANCE TO VERIFY THE FUNCTIONALITY OF A CIRCUIT DESIGN

BACKGROUND

1. Field

This disclosure is generally related to electronic design automation (EDA). More specifically, this disclosure is related to methods and apparatuses for verifying the functionality of a circuit design by using an abstraction-refinement technique.

2. Related Art

Advances in semiconductor fabrication technology have given rise to dramatic increases in the number of transistors per semiconductor device. This increase in transistor count is empowering computer architects to create digital circuit designs with an ever-increasing design complexity. Consequently, as digital circuit designs become more complex, the effort required to verify the correctness of their implementation also becomes more involved.

To verify the functionality of a circuit design, circuit design verification teams typically perform simulation-based verification methods, formal verification methods, or a combination of the two. During simulation-based verification, verification teams typically apply random input stimuli onto a circuit design under verification (CUV) to stimulate the CUV and compare the response from simulation to the expected response. Simulating the CUV against random input stimuli is probabilistic in nature and relies on a high volume of input vectors to achieve a reasonable coverage of the behavior of the CUV. However, as the circuit designs become more complex, the random input stimuli become less effective at covering the important corner cases of the CUV.

During a formal verification, verification teams typically attempt to prove or disprove the correctness of the CUV's functionality. Formal verification typically involves constructing a formal specification and/or a collection of properties that define the correct functionality of the CUV, and then using formal proofs to determine whether the implementation of the CUV satisfies the formal specification and/or the collection of properties. However, formal verification can be computationally expensive unless specific techniques are used to make verification more efficient.

Abstraction-refinement is one such approach which creates an abstract mathematical model of the CUV, and expands the abstract model until the property is satisfied or a counter-example for the CUV is found. Specifically, if the abstraction-refinement procedure determines that the property is satisfied by the abstract model, then it determines that the property is also satisfied by the CUV. On the other hand, if the abstract model becomes functionally equivalent to the CUV, and the formal verification technique finds a counter-example, then the abstraction-refinement procedure determines that the property is not satisfied by the CUV. Unfortunately, even the abstraction-refinement approach can be computationally expensive. Hence, it is desirable to improve the efficiency of formal verification techniques that use abstraction-refinement.

SUMMARY

Some embodiments provide methods and apparatuses for verifying the functionality of a circuit design. More specifically, some embodiments improve the performance of a formal verification tool that uses abstraction-refinement by determining when the tool can avoid performing reachability analysis.

A property can be defined using a set of state variables, such that each state variable is associated with a sequential element in the CUV. The length of a path between two sequential elements can be based in part on the number of sequential elements in the path, such that the distance between two state variables is equal to the length of a shortest path between two sequential elements that are associated with the two state variables.

The lower-bound-distance (LBD) of an abstract model can be defined as follows. An abstract model's LBD is equal to k if the abstract model contains all state variables in the CUV which are at a distance of k or less from a state variable in the property. Stated differently, a lower-bound-distance, k, of an abstract model is a distance value, such that all state variables that are at a distance of k or less are in the abstract model.

An upper-bound-distance for an abstract model can be defined as the largest distance value between a state variable in the abstract model and a state variable in the property.

In some embodiments, the system can construct an abstract model, called the LBD abstract model, which includes at least all state variables of the CUV that are at a distance of k or less from a state variable in the property. Note that the LBD of this abstract model is k. Then, the system can determine whether a counter-example exists for the property by using the LBD abstract model. If a counter-example exists, then the system can store the value k so that an abstraction-refinement technique can use the stored LBD value to determine whether the reachability analysis can be skipped. On the other hand, if no counter-example exists, the system can determine that the property is satisfied by the CUV.

Specifically, the abstraction-refinement technique can compute an upper-bound-distance for an abstract model, and determine whether the current LBD value is greater than or equal to the upper-bound-distance. If the current LBD value is greater than or equal to the upper-bound-distance, the abstraction-refinement technique can conclude that the abstract model does not satisfy the property, and the abstract-refinement technique may decide not to perform a reachability analysis on the abstract model. Note that the system can perform the LBD computations concurrently with abstraction refinement.

The system can determine counter-examples using numerous techniques which include, but are not limited to, binary decision diagram (BDD)-based techniques, automatic test pattern generator (ATPG)-based techniques, and satisfiability (SAT)-based techniques. The SAT-based techniques include, but are not limited to, bounded model checking (BMC), induction, and interpolation.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Integrated Circuit (IC) Design Flow

Figure 1:
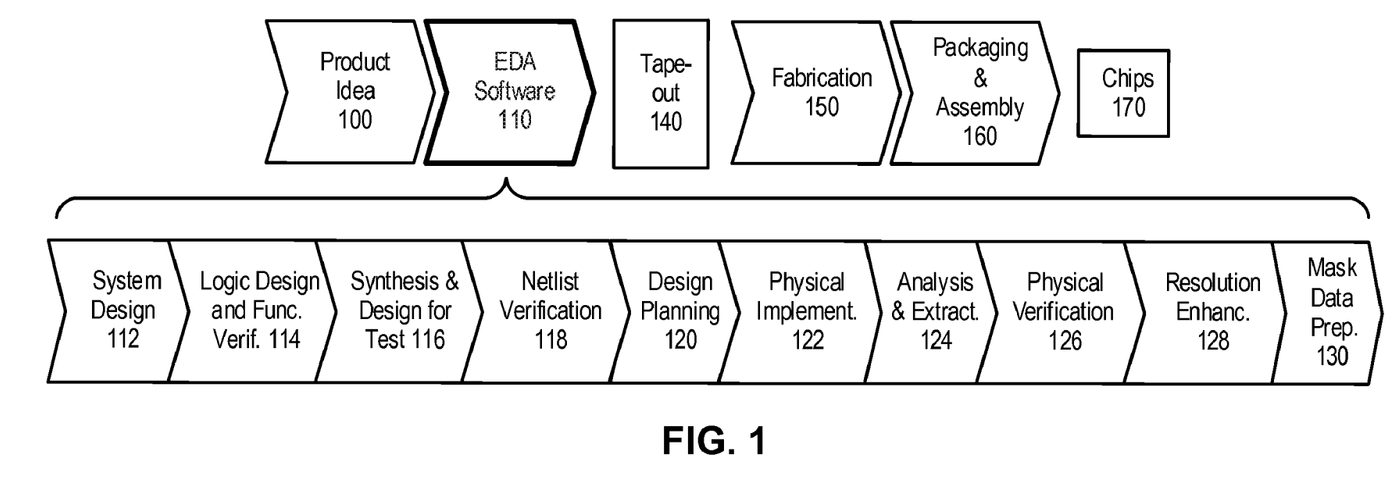
FIG. 1 illustrates various stages in the design and fabrication process of an integrated circuit in accordance with an embodiment.

FIG. 1 illustrates various stages in the design and fabrication process of an integrated circuit in accordance with an embodiment.

The IC design process typically begins with a product idea (operation 100) which is realized using an EDA process (operation 110). Once the design is finalized, it is typically taped-out (event 140), at which point it goes through a fabrication process (operation 150) and packaging and assembly processes (operation 160) to produce manufactured microchips (result 170).

The EDA process (operation 110) comprises operations 112-130, which are described below for illustrative purposes only and are not meant to limit the present invention. Specifically, an actual integrated circuit design may require a designer to perform the design operations in a different sequence than the sequence described below.

System design (operation 112): In this stage, the designers describe the functionality that implements the product idea. They can also perform what-if planning to refine the functionality, perform cost analysis, etc. Hardware-software architecture partitioning can occur at this stage. Exemplary EDA software products from Synopsys, Inc. that can be used at this stage include Model Architect, Saber®, System Studio, and DesignWare®.

Logic design and functional verification (operation 114): At this stage, the VHDL or Verilog code for modules in the system is written and the design is checked for functional accuracy. More specifically, the design is checked to ensure that it produces a correct response. Exemplary EDA software products from Synopsys, Inc. that can be used at this stage include VCS®, Vera®, DesignWare®, Magellan™, Formality®, ESP and Leda®.

Synthesis and design for test (operation 116): The VHDL/Verilog source code can be translated to a netlist in this stage. The netlist can be optimized for the target technology, and tests can be designed and implemented to check the manufactured microchips. Exemplary EDA software products from Synopsys, Inc. that can be used at this stage include Design Compiler®, Physical Compiler®, Test Compiler, Power Compiler™, FPGA Compiler, TetraMAX®, and DesignWare®.

Netlist verification (operation 118): In this stage, the netlist is checked for compliance with timing constraints and for correspondence with the VHDL/Verilog source code. Exemplary EDA software products from Synopsys, Inc. that can be used at this stage include Formality®, PrimeTime®, and VCS®.

Design planning (operation 120): In this stage, an overall floorplan for the microchip is constructed and analyzed for timing and top-level routing. Exemplary EDA software products from Synopsys, Inc. that can be used at this stage include Astro™ and IC Compiler products.

Physical implementation (operation 122): The placement (positioning of circuit elements) and routing (placement of interconnections) occur at this stage. Exemplary EDA software products from Synopsys, Inc. that can be used at this stage include Astro™ and IC Compiler products.

Analysis and extraction (operation 124): At this stage, the circuit function is verified at a transistor level; this, in turn, permits what-if refinement. Exemplary EDA software products from Synopsys, Inc. that can be used at this stage include AstroRail™, PrimeRail, PrimeTime®, and Star-RCXT™.

Physical verification (operation 126): In this stage, the design is checked to ensure correctness for manufacturing, electrical issues, lithographic issues, and circuitry. Hercules™ is an exemplary EDA software product from Synopsys, Inc. that can be used at this stage.

Resolution enhancement (operation 128): This stage involves geometric manipulations of the layout to improve manufacturability of the design. Exemplary EDA software products from Synopsys, Inc. that can be used at this stage include Proteus/Progen, ProteusAF, and PSMGen.

Mask data preparation (operation 130): This stage provides the "tape-out" data for production of masks to produce finished chips. Exemplary EDA software products from Synopsys, Inc. that can be used at this stage include the CATS® family of products.

Verification Environment

Figure 2:
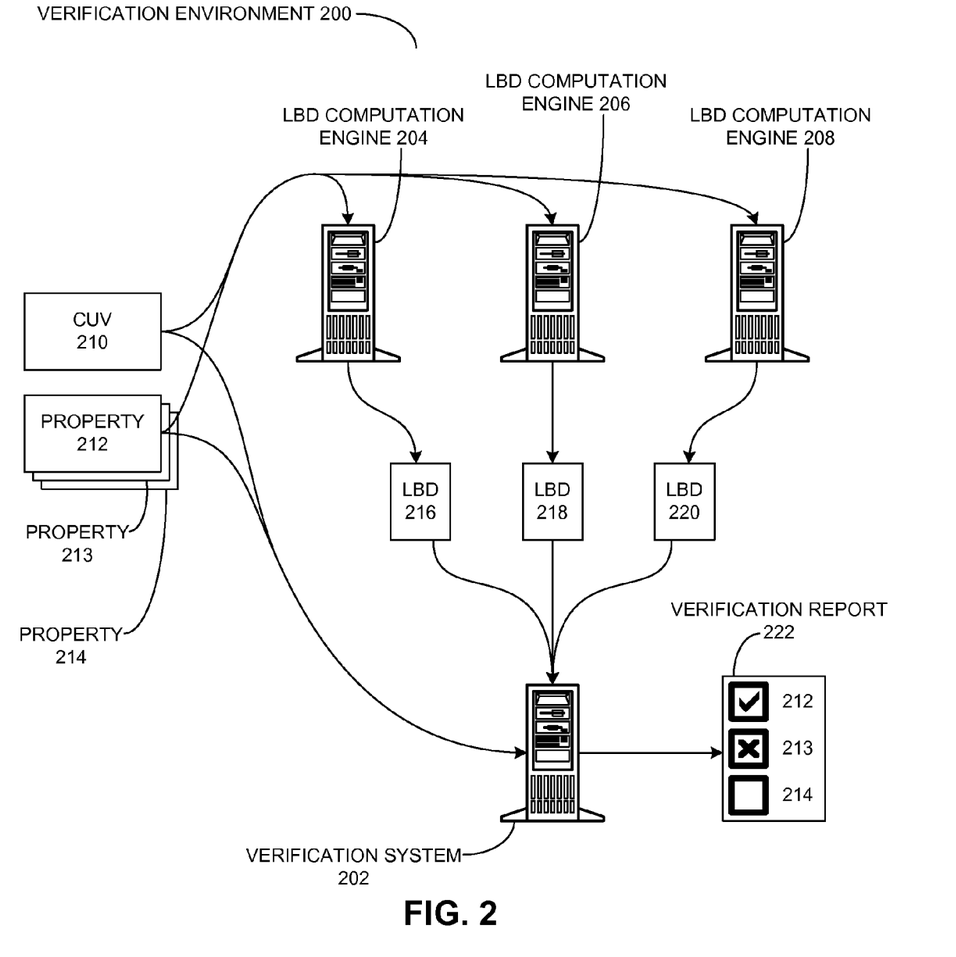
FIG. 2 illustrates a verification environment in accordance with an embodiment.

FIG. 2 illustrates a verification environment in accordance with an embodiment. Verification environment 200 includes a verification system 202, and a number of LBD computation engines 204-208. In some variations on these embodiments, verification system 202 can include LBD computation engines 204-208. LBD computation engines 204-208 take CUV 210 and property 212 as input, and generate lower-bound-distances (LBDs) 216-220, respectively. Verification system 202 takes CUV 210, property 212, and LBDs 216-220 as input, and generates a verification report 222 for CUV 210. In some embodiments, CUV 210 can be implemented using a hardware description language (HDL). In other embodiments, CUV 210 can be implemented as a gate-level design.

In some embodiments, a property (e.g., property 212) is defined using a set of state variables, such that each state variable is associated with a sequential element in CUV 210. A property can be either a safety property, or an unreachability property. Safety properties specify a set of constraints which must be satisfied by the CUV 210 during normal operating conditions. Therefore, verification system 202 can determine that CUV 210 implements an illegal state when it determines that CUV 210 cannot satisfy the set of constraints for a given safety property during normal operating conditions. Conversely, unreachability properties specify a set of constraints which must not be satisfied by CUV 210 during normal operating conditions. Therefore, verification system 202 can determine that CUV 210 implements an illegal state when it determines that CUV 210 can satisfy a constraint from a given unreachability property during normal operating conditions.

In some embodiments, verification environment 200 performs verification on CUV 210 by first converting properties 212-214 into unreachability properties.

In some embodiments, the length of a path between two sequential elements in CUV 210 is based in part on the number of sequential elements in the path, such that the distance between two state variables is equal to the length of a shortest path between two sequential elements that are associated with the two state variables. Based on these definitions, a lower-bound-distance is a numerical value which identifies a set of state variables of CUV 210 that represent an insufficient portion of CUV 210 for satisfying the property, such that these identified state variables of CUV 210 have a distance from a state variable in the property that is less than or equal to the lower-bound-distance.

During operation, LBD computation engine 204 determines a lower-bound-distance 214 for property 212 by first generating an LBD abstract model. An abstract model is a mathematical or logical representation of a simplified abstract interpretation of CUV 210. In some embodiments, an abstract model can include a number of state variables from CUV 210, and can include logic associated with these state variables. LBD computation engine 204 uses the LBD abstract model of CUV 210 to determine whether a counter-example exists for property 212. If a counter-example exists, then LBD computation engine 204 computes the lower-bound-distance for the LBD abstract model, and sends the lower-bound-distance value to verification system 202.

On the other hand, if a counter-example does not exist, then LBD computation engine 204 determines that the LBD abstract model satisfies property 212. Note that, because the LBD abstract model includes a subset of the state variables of CUV 210, it follows that CUV 210 satisfies property 212 when the LBD abstract model satisfies property 212. Therefore, when a counter-example does not exist for property 212, LBD computation engine 204 informs verification system 202 that CUV 210 satisfies property 212.

In some embodiments, LBD computation engine 204 computes a lower-bound-distance for the LBD abstract model by first determining, for a set of frontier state variables in the LBD abstract model, their respective distances to a state variable of the property. Then, LBD computation engine 204 identifies the smallest distance from the set of distances determined for the set of frontier state variables, and sets the lower-bound-distance to the identified smallest distance. Note that a frontier state variable is an outer most state variable in the LBD abstract model, such that the frontier state variable does not have a fan-in variable that is a state variable. Also note that a frontier state variable can have fan-in variables that are primary input variables, or are pseudo-input variables (i.e., variables which are internal to CUV 210, but are not state variables).

In some embodiments, when LBD computation engine 204 determines a new lower-bound-distance value which is greater than any previous lower-bound-distance value, LBD computation engine 204 can communicate the new lower-bound-distance value to LBD computation engines 206-208. Similarly, LBD computation engine 204 can receive a new lower-bound-distance value from LBD computation engines 206-208. This allows LBD computation engines 204-208 to be aware of the largest lower-bound-distance value at all times, regardless of which LBD computation engine determines the new lower-bound-distance value.

In some embodiments, a frontier distance is the distance to the frontier state variable in the LBD abstract model that is furthest from a state variable of the property. In some embodiments, the frontier state variables have a distance to a state variable of the property that is either the frontier distance, or a distance previous to the frontier distance (i.e., frontier-distance minus 1).

During operation, verification system 202 performs an abstraction-refinement process to determine whether a property (e.g., property 212) can be satisfied by CUV 210. In doing so, verification system 202 begins by generating a second abstract model for the property by using the CUV. Then, verification system 202 performs reachability analysis on the second abstract model to determine whether the second abstract model satisfies the property. If so, then verification system 202 determines that CUV 210 satisfies the property as well. Otherwise, verification system 202 continues on to generate a counter-example for the property by using the second abstract model. Verification system 202 can then refine the second abstract model by augmenting the second abstract model with a state variable from CUV 210, and can repeat the process by performing a reachability analysis once again.

In some embodiments, verification system 202 can determine whether it can avoid performing a reachability analysis on the second abstract model by first computing an upper-bound-distance for the second abstract model, which specifies the largest distance between a state variable in the property and a frontier state variable of the second abstract model. Then, verification system 202 can compare the lower-bound-distance to the upper-bound-distance to determine whether the lower-bound-distance is greater than or equal to the upper-bound-distance. If so, then verification system 202 has determined that the current abstract model does not satisfy the property, and thus it does not need to perform a reachability analysis on the abstract model.

In some embodiments, verification system 202 and LBD computation engines 204-208 execute in parallel. For example, LBD computation engine 204 can compute a lower-bound-distance 216 for property 212 by employing a solver that is based on binary decision diagrams (BDDs) as the underlying algorithm. At the same time, LBD computation engine 206 can compute a lower-bound-distance 218 for property 212 by employing a Boolean satisfiability (SAT) solver as the underlying algorithm, and LBD computation engine 208 can compute a lower-bound-distance 220 for property 212 by employing automatic test pattern generation (ATPG) as the underlying solver. This parallel computing infrastructure is beneficial because one LBD solver may be advantageous for analyzing a first class of circuits, while a second LBD solver may be advantageous for analyzing a second class of circuits.

Furthermore, in some embodiments, two respective LBD computation engines may begin their lower-bound-distance computations by generating an initial abstract model with different lower-bound-distances. For example, LBD computation engine 204 may begin its LBD computation by generating an initial abstract model with an initial lower-bound-distance LBD=3, while LBD computation engine 206 may begin its LBD computation by generating an initial abstract model with an initial lower-bound-distance LBD=6. It is advantageous to allow multiple LBD computation engines to begin their lower-bound-distance computations at different lower-bound-distance values, because doing so enables verification environment 200 to deploy a number of computing resources for determining a largest lower-bound-distance for a property without having to sweep across all possible distance values.

In some embodiments, this parallel computing infrastructure allows verification system 202 to select the largest lower-bound-distance value that is computed by any of LBD computation engines 204-208. That is, as LBD computation engines 204-208 compute and update their respective lower-bound-distance values, verification system 202 can select the largest lower-bound-distance value from the set at any point in its execution. Note that, by providing verification system 202 with the largest possible lower-bound-distance value, LBD computation engines 204-208 are increasing the likelihood that verification system 202 will be able to avoid performing a reachability analysis for a number of iterations of the abstraction-refinement process.

Figure 3:
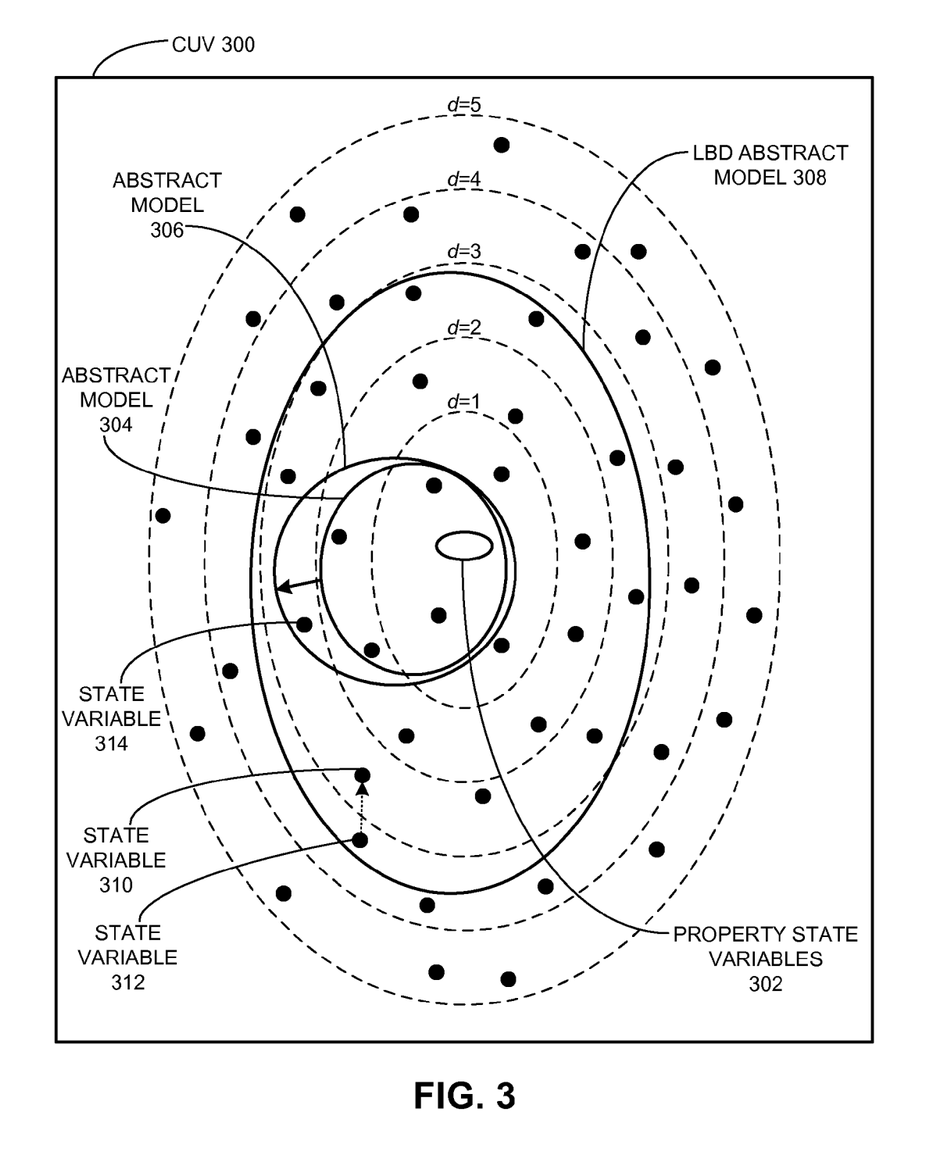
FIG. 3 illustrates an exemplary illustration for a number of abstract models associated with a CUV in accordance with an embodiment.

FIG. 3 illustrates an exemplary illustration for a number of abstract models associated with a CUV in accordance with an embodiment. CUV 300 includes a number of state variables (e.g., state variables 310-314), and one or more state variables from a property (illustrated by property state variables 302). Note that a respective state variable from CUV 300 is associated with a distance to a state variable in property state variables 302, and that the distance boundaries are illustrated by dashed ellipsoids. For example, state variable 312 has a distance d=4 to a state variable in property state variables 302, and thus state variable 312 is illustrated between the ellipsoids for distance boundaries d=3 and d=4.

Abstract models 304-308 illustrate a computation snapshot for a verification process. LBD abstract model 308 can be generated by an LBD computation engine during its procedure for determining a lower-bound-distance for a property. Furthermore, LBD abstract model 308 includes all state variables of CUV 300 are associated with a distance d≦3 (i.e., have a distance d≦3 to a state variable in property state variables 302), and includes state variable 312 which is associated with a distance d=4. Note that state variable 312 is a fan-in state variable to state variable 310 (illustrated by a dashed arrow); therefore, the set of frontier state variables for LBD abstract model 308 includes all state variables associated with a distance d=3 except for state variable 310, and includes state variable 312 which is associated with a distance d=4. A lower-bound-distance is defined as the minimum of the set of distances from a frontier state variable to a state variable in a property; therefore, the lower-bound-distance for LBD abstract model 308 is LBD=3. Furthermore, because a frontier distance, D, of an abstract model is defined as the maximum of the set of distances from a frontier state variable to a state variable in a property, the frontier distance for LBD abstract model 308 is D=4.

Similarly, abstract models 304-306 are generated by a verification system during its abstraction-refinement procedure for verifying a property for CUV 300. More specifically, the verification system may generate abstract model 304 during a first iteration of the abstraction-refinement procedure, and may refine abstract model 304 to generate abstraction model 306 during a subsequent iteration of the abstraction-refinement procedure by augmenting abstract model 304 with state variable 314. Furthermore, because an upper-bound-distance is defined as the maximum of the set of distances from a frontier state variable to a state variable in a property, the upper-bound-distance for abstract model 304 is UBD=3.

Notice that, for the example illustrated in FIG. 3, the computed lower-bound-distance is greater than or equal to the computed upper-bound-distance. Therefore, the abstraction-refinement procedure in the verification system can rely on the lower-bound-distance to determine that abstract model 306 does not satisfy the property, thereby avoiding having to perform a reachability analysis on abstract model 306.

Figure 4:
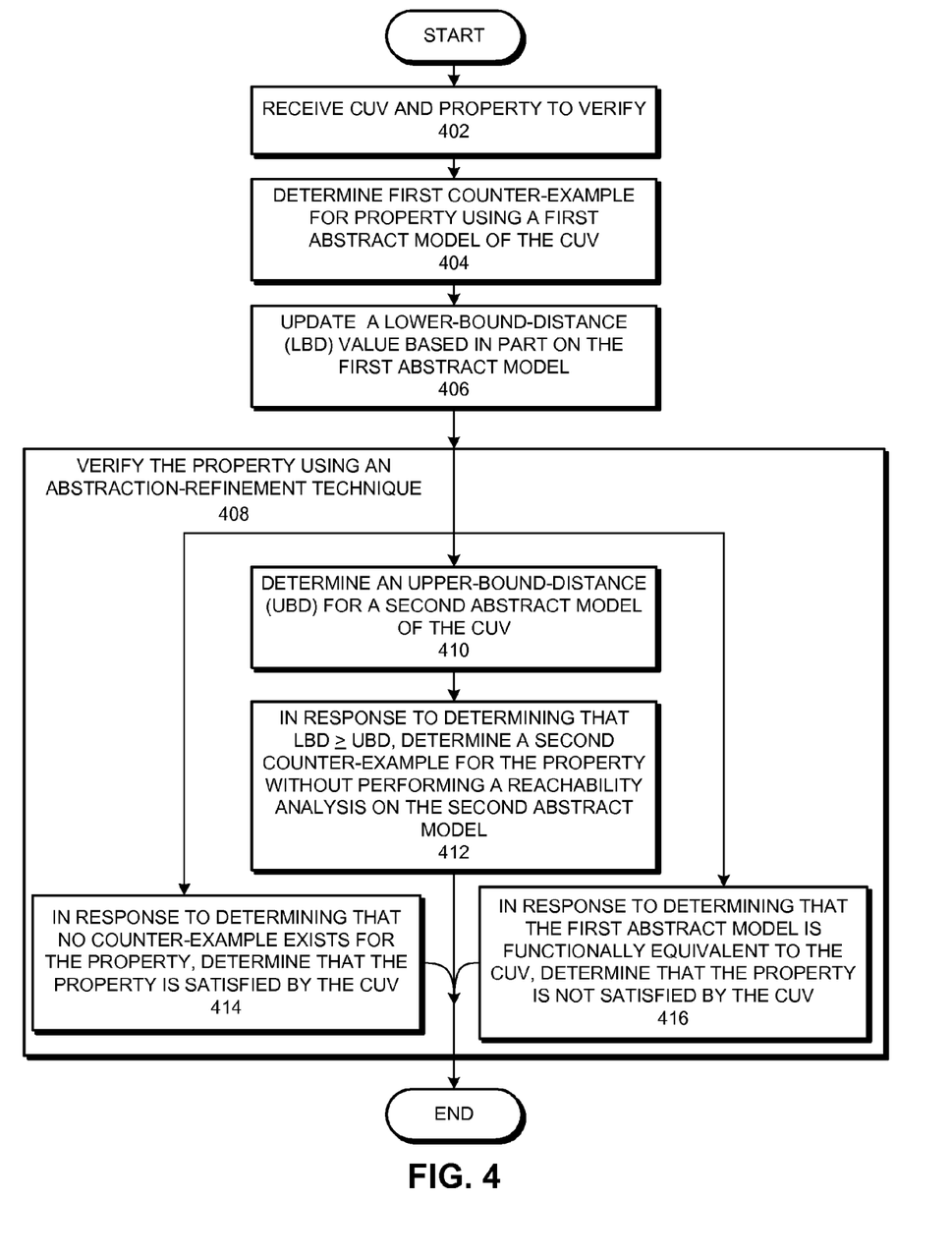
FIG. 4 presents a flow chart illustrating a process for verifying a property for a circuit design using an abstraction-refinement technique in accordance with an embodiment.

FIG. 4 presents a flow chart illustrating a process for verifying a property for a circuit design using an abstraction-refinement technique in accordance with an embodiment. In some embodiments, the process can be performed by a computer system, which includes a computer-readable storage medium storing instructions that when executed by the computer system cause the computer system to perform the process. The system can begin by receiving a CUV and a property to verify (operation 402). Next, the system determines a first counter-example for the property by using a first abstract model of the CUV (operation 404), and updates a lower-bound-distance value based in part on the first abstract model (operation 406). The system then verifies the property using an abstraction-refinement technique (operation 408).

While verifying the property using an abstraction-refinement technique, the system determines an upper-bound-distance for a second abstract model of the CUV (operation 410). Then, in response to determining that the lower-bound-distance is greater than or equal to the upper-bound-distance, the system determines a second counter-example for the property without performing a reachability analysis on the second abstract model (operation 412).

In some embodiments, while verifying the property using an abstraction-refinement technique, and in response to determining that no counter-example exists for the property, the system determines that the property is satisfied by the CUV (operation 414).

In some embodiments, while verifying the property using the abstraction-refinement technique, and in response to determining that the first abstract model is functionally equivalent to the CUV, the system determines that the property is not satisfied by the CUV (operation 416).

Figure 5:
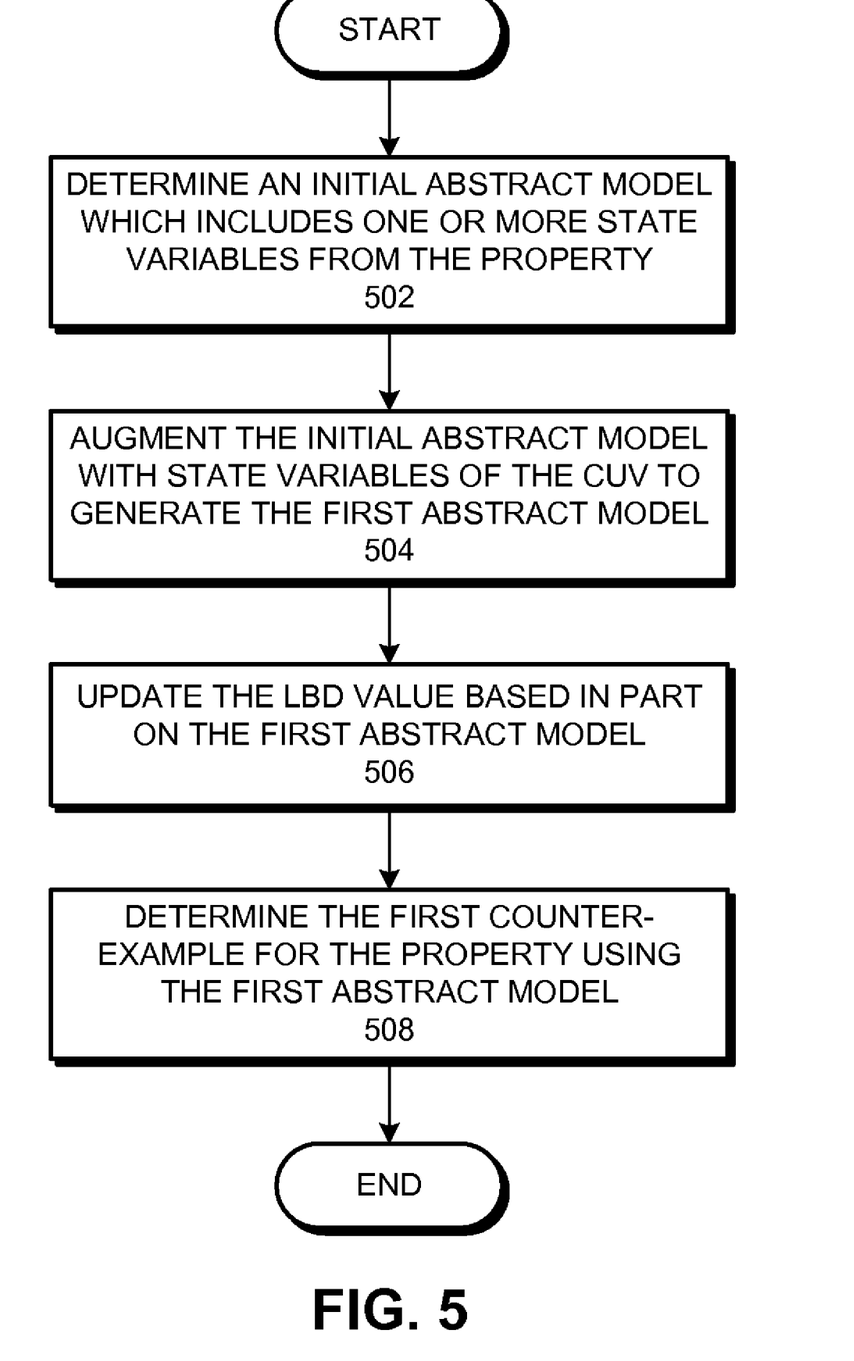
FIG. 5 presents a flow chart illustrating a process for determining a counter-example for a property in accordance with an embodiment.

FIG. 5 presents a flow chart illustrating a process for determining a counter-example for a property in accordance with an embodiment. In some embodiments, the process can be performed by a computer system which implements an LBD computation engine. The system can begin by determining an initial abstract model which includes one or more state variables of the property (operation 502). Then, the system augments the initial abstract model with state variables of the CUV to generate the first abstract model (operation 504). The system then updates the lower-bound-distance value based in part on the first abstract model (operation 506), and determines the first counter-example for the property using the first abstract model (operation 508).

Figure 6:
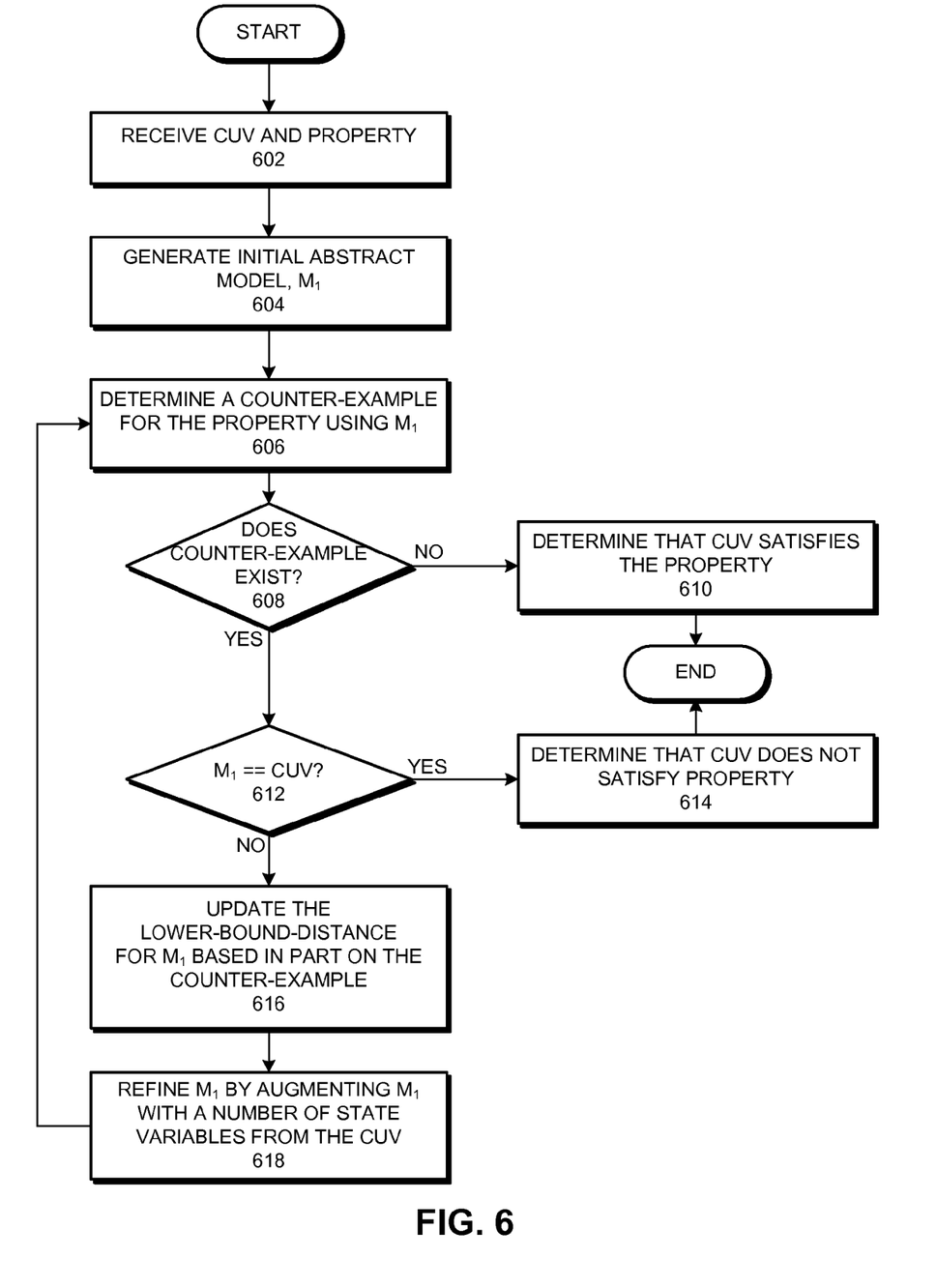
FIG. 6 presents a flow chart illustrating an iterative process for computing a lower-bound-distance for a property in accordance with an embodiment.

FIG. 6 presents a flow chart illustrating an iterative process for computing a lower-bound-distance for a property in accordance with an embodiment. In some embodiments, the process can be performed by a computer system which implements an LBD computation engine. The system can begin by receiving a CUV and a property (operation 602), generating an initial abstract model, $M_1$, for the property (operation 604), and determining a counter-example for the property using the abstract model $M_1$ (operation 606). The system then determines whether a counter-example exists (operation 608). If a counter-example does not exist, the system determines that the CUV satisfies the property (operation 610). Otherwise, the system continues to determine whether the abstract model, $M_1$, is functionally equivalent to the CUV (operation 612). If so, the system determines that the CUV does not satisfy the property (operation 614). Otherwise, the system continues to update the lower-bound-distance for the abstract model $M_1$ based in part on the counter-example (operation 616). The system then refines the abstract model $M_1$ by augmenting $M_1$ with a number of state variables from the CUV (operation 618), and returns to operation 606.

In some embodiments, when performing operation 604, the system can generate the abstract model $M_1$, such that it has an initial lower-bound-distance of LBD=1. In other embodiments, the system can generate the abstract model $M_1$, such that it has an arbitrary initial lower-bound-distance value of LBD=N.

In some embodiments, the system can compute a lower-bound-distance by using binary decision diagrams (BDDs). In some other embodiments, the system can compute a lower-bound-distance by using an automatic test pattern generator (ATPG). In other embodiments, the system can compute a lower-bound-distance by using a Boolean satisfiability (SAT) solver. Some exemplary algorithms for the SAT solver include, but are not limited to, bounded model checking (BMC), induction, and interpolation.

Note that, because the abstract model is growing monotonically, the system can reuse information it gathers during one process iteration to optimize the computations it performs for a subsequent iteration. Doing so allows the system to avoid performing redundant computations. For example, when performing a bounded-model-checking (BMC) computation, the system can use the bounded depth used by the previous process iteration as the starting bounded depth for the current process iteration. Similarly, when performing an induction computation, the system can use the induction depth used by the previous process iteration as the starting induction depth for the current process iteration. Furthermore, when performing an interpolation computation, the system can use the interpolation depth used by the previous process iteration as the starting interpolation depth for the current process iteration.

Figure 7:
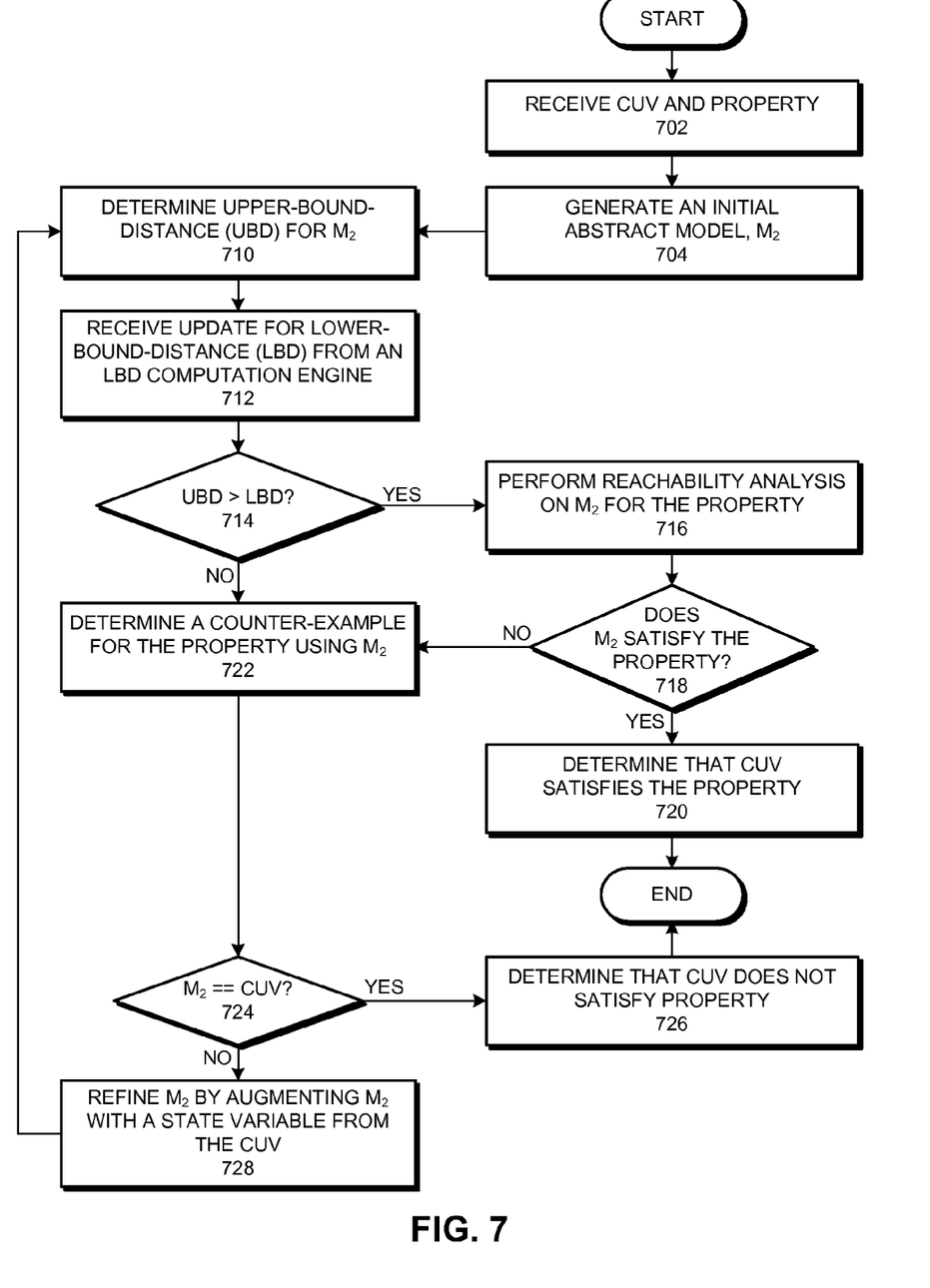
FIG. 7 presents a flow chart illustrating an abstraction-refinement process for verifying a property for a circuit design in accordance with an embodiment.

FIG. 7 presents a flow chart illustrating an abstraction-refinement process for verifying a property for a circuit design in accordance with an embodiment. The system can begin by receiving a CUV and a property (operation 702), and generating an initial abstract model, $M_2$, for the property (operation 704). Next, the system computes an upper-bound-distance (UBD) for $M_2$ (operation 710), and receives an update for a lower-bound-distance from an LBD computation engine (operation 712).

The system then determines whether the upper-bound-distance is greater than the lower-bound-distance (operation 714). If so, the system performs a reachability analysis on the abstract model $M_2$ to determine if the property can be satisfied by $M_2$ (operation 716). Next, the system determines, in response to the reachability analysis, whether the abstract model $M_2$ satisfies the property (operation 718). If $M_2$ satisfies the property, then the system determines that the CUV satisfies the property (operation 720). Otherwise, if $M_2$ does not satisfy the property, the system continues to determine a counter-example for the property using $M_2$ (operation 722). The system then determines whether the abstract model, $M_2$, is functionally equivalent to the CUV (operation 724). If so, the system determines that the CUV does not satisfy the property (operation 726). Otherwise, the system refines the abstract model $M_2$ by augmenting $M_2$ with a state variable from the CUV (operation 728), and returns to operation 710. In some embodiments, the state variable that is being augmented onto abstract model $M_2$ has a distance to a state variable of the property that is less than or equal to the upper-bound-distance+1.

Note that, if operation 714 determines that the lower-bound-distance is greater than or equal to the upper-bound-distance, the system continues onto operation 722 without performing the reachability analysis computation of operation 716, thereby avoiding a computationally expensive operation.

Computing System

Figure 8:
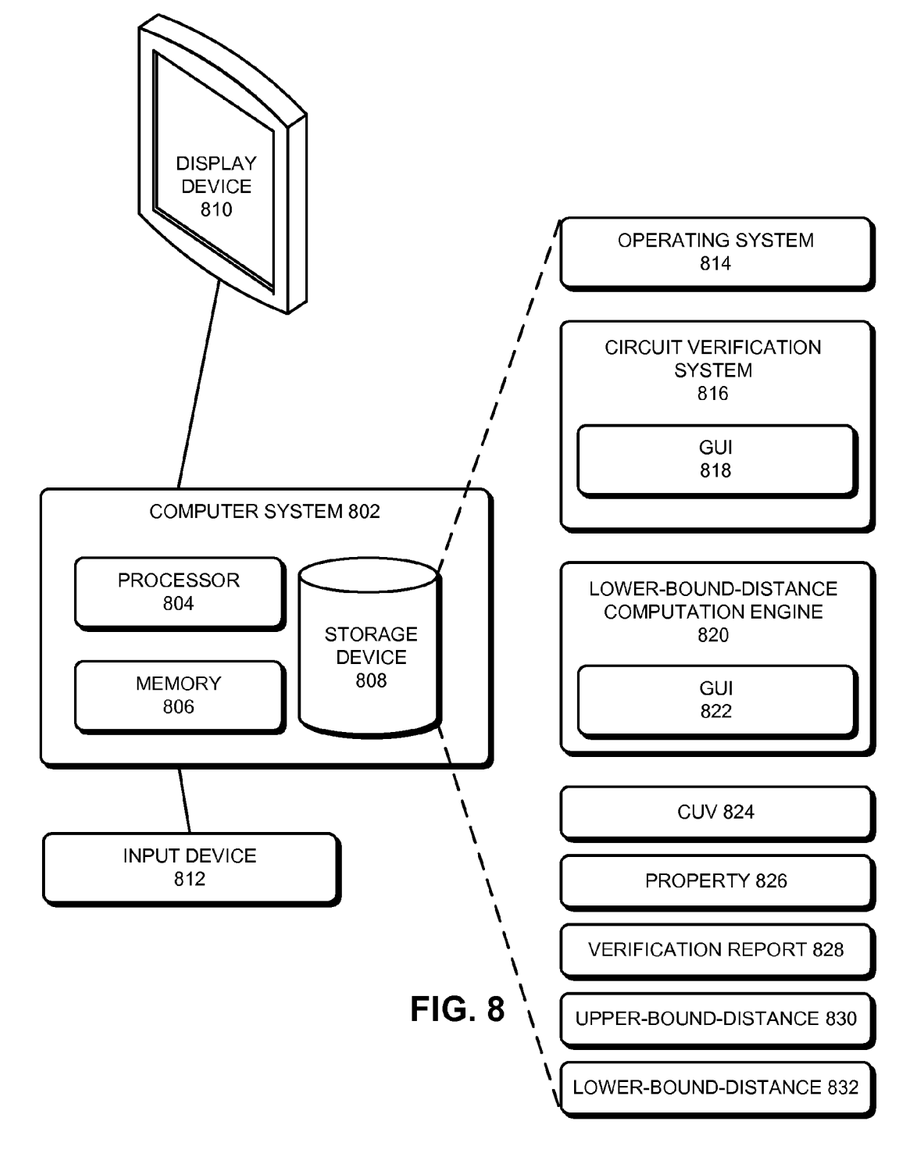
FIG. 8 illustrates an exemplary computer system that facilitates verifying the functionality of a CUV in accordance with an embodiment.

FIG. 8 illustrates an exemplary computer system that facilitates verifying the functionality of a CUV in accordance with an embodiment. Computer system 802 includes a processor 804, a memory 806, and a storage device 808. Furthermore, computer system 802 can be coupled to a display device 810 and an input device 812.

Storage device 808 stores an operating system 814, a circuit verification system 816, an LBD computation engine 820, a CUV 824, a property 826, a verification report 828, an upper-bound-distance 830, and a lower-bound-distance 832. Circuit verification system 816 can include a graphical user interface (GUI) 818, and LBD computation engine 820 can include a GUI 822.

During operation, circuit verification system 816 is loaded from storage device 808 into memory 806 and is executed by processor 804. In some variations, circuit verification system 816 can be implemented in a hardware module, such as an ASIC or an FPGA. In some embodiments, circuit verification system 816 can perform an abstraction-refinement procedure to verify that CUV 824 satisfies a property 826. In doing so, circuit verification system 816 generates an abstract model for CUV 824, and expands the abstract model until either property 826 is satisfied by the abstract model, or the abstract model becomes functionally equivalent to CUV 824. If circuit verification system 816 determines that property 826 is satisfied by the abstract model, then it determines that property 826 is also satisfied by CUV 824. On the other hand, if the abstract model becomes functionally equivalent to CUV 824 and the abstract model does not satisfy property 826, then circuit verification system 816 determines that property 826 is not satisfied by CUV 824. Circuit verification system 816 then generates a verification report 828, which can specify whether CUV 824 satisfies property 826 and/or can provide a counter-example to property 826.

Circuit verification system 816 also determines an upper-bound-distance 830 for the abstract model, and compares it to a lower-bound-distance 832 to determine whether lower-bound-distance 832 is greater than or equal to upper-bound-distance 830. If so, then circuit verification system 816 has determined that the abstract model does not satisfy property 826, and thus can avoid performing a reachability analysis on the abstract model.

During operation, LBD computation engine 820 is loaded from storage device 808 into memory 806 and is executed by processor 804. In some variations, LBD computation engine 820 can be implemented in a hardware module, such as an ASIC or an FPGA. In some embodiments, LBD computation engine 820 can determine a value for lower-bound-distance 832. In doing so, LBD computation engine 820 generates a second abstract model which includes state variables of CUV 824 that have a distance of k from a state variable of property 826. Then, LBD computation engine 820 determines whether a counter-example exists for property 826 by using the second abstract model of CUV 824. If a counter-example exists, then LBD computation engine 820 updates the value for lower-bound-distance 832 to k. Otherwise, if a counter-example does not exist, then LBD computation engine 820 determines that property 826 is satisfied by the second abstract model, and thus property 826 is also satisfied by CUV 824.

In some embodiments, circuit verification system 816 and LBD computation engine 820 can be executed in parallel by computer system 802.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method to verify a property for a circuit design, the method comprising:
   determining a first counter-example for the property using a first abstract model of the circuit design, wherein the property is associated with a set of state variables, and wherein the first abstract model includes all state variables whose distance from at least one state variable in the set of state variables is less than or equal to a lower-bound-distance; and
   verifying, by computer, the property based on an abstraction-refinement technique, wherein said verifying includes:
      determining an upper-bound-distance for a second abstract model of the circuit design, wherein the upper-bound-distance is equal to the largest distance in a set of distances between state variables in the set of state variables and state variables in the second abstract model; and
      in response to determining that the lower-bound-distance is greater than or equal to the upper-bound-distance, determining a second counter example for the property without performing a reachability analysis on the second abstract model.

2. The method of claim 1, wherein the abstraction-refinement technique further comprises:
   in response to determining that no counter-example exists for the property, determining that the property is satisfied by the circuit design.

3. The method of claim 1, wherein the abstraction-refinement technique further comprises:
   in response to determining that the first abstract model is functionally equivalent to the circuit design, determining that the property is not satisfied by the circuit design.

4. The method of claim 1, wherein prior to determining the first counter-example for the property, the method further comprises generating the first abstract model by:
   determining an initial abstract model which includes one or more state variables from the property;
   augmenting the initial abstract model with state variables of the circuit design to generate the first abstract model; and
   computing the lower-bound-distance for the first abstract model.

5. The method of claim 4, wherein computing the lower-bound-distance for the first abstract model comprises using at least one of: a binary decision diagram (BDD); a Boolean satisfiability (SAT) solver; and an automatic test pattern generator (ATPG).

6. The method of claim 1, wherein determining the first counter-example for the property using the first abstract model is performed concurrently with verifying the property using the abstraction-refinement technique.

7. A non-transitory computer-readable storage medium storing instructions that when executed by a computer cause the computer to perform a method to verify a property for a circuit design, the method comprising:
   determining a first counter-example for the property using a first abstract model of the circuit design, wherein the property is associated with a set of state variables, and wherein the first abstract model includes all state variables whose distance from at least one state variable in the set of state variables is less than or equal to a lower-bound-distance; and
   verifying the property based on an abstraction-refinement technique, wherein said verifying includes:
      determining an upper-bound-distance for a second abstract model of the circuit design, wherein the upper-bound-distance is equal to the largest distance in a set of distances between state variables in the set of state variables and state variables in the second abstract model; and
      in response to determining that the lower-bound-distance is greater than or equal to the upper-bound-distance, determining a second counter example for the property without performing a reachability analysis on the second abstract model.

8. The computer-readable storage medium of claim 7, wherein the abstraction-refinement technique further comprises:
   in response to determining that no counter-example exists for the property, determining that the property is satisfied by the circuit design.

9. The computer-readable storage medium of claim 7, wherein the abstraction-refinement technique further comprises:
   in response to determining that the first abstract model is functionally equivalent to the circuit design, determining that the property is not satisfied by the circuit design.

10. The computer-readable storage medium of claim 7, wherein prior to determining the first counter-example for the property, the method further comprises generating the first abstract model by:
    determining an initial abstract model which includes one or more state variables from the property;
    augmenting the initial abstract model with state variables of the circuit design to generate the first abstract model; and
    computing the lower-bound-distance for the first abstract model.

11. The computer-readable storage medium of claim 10, wherein computing the lower-bound-distance for the first abstract model comprises using at least one of: a binary decision diagram (BDD); a Boolean satisfiability (SAT) solver; and an automatic test pattern generator (ATPG).

12. The computer-readable storage medium of claim 7, wherein determining the first counter-example for the property using the first abstract model is performed concurrently with verifying the property using the abstraction-refinement technique.

13. An apparatus for verifying a property for a circuit design, the apparatus comprising:
   a lower-bound-distance (LBD) computation engine configured to determine a first counter-example for the property using a first abstract model of the circuit design, wherein the property is associated with a set of state variables, and wherein the first abstract model includes all state variables whose distance from at least one state variable in the set of state variables is less than or equal to a lower-bound-distance; and
   a verification engine configured to verify the property based on an abstraction-refinement technique, wherein the verification engine is configured to:
      determine an upper-bound-distance for a second abstract model of the circuit design, wherein the upper-bound-distance is equal to the largest distance in a set of distances between state variables in the set of state variables and state variables in the second abstract model; and
      in response to determining that the lower-bound-distance is greater than or equal to the upper-bound-distance, determine a second counter example for the property without performing a reachability analysis on the second abstract model.

14. The apparatus of claim 13, wherein the verification engine is configured to determine that the property is satisfied by the circuit design in response to determining that no counter-example exists for the property.

15. The apparatus of claim 13, wherein the verification engine is configured to determine that the property is not satisfied by the circuit design in response to determining that the first abstract model is functionally equivalent to the circuit design.

16. The apparatus of claim 13, wherein prior to determining the first counter-example for the property, the LBD computation engine is configured to generate the first abstract model by:
   determining an initial abstract model which includes one or more state variables from the property;
   augmenting the initial abstract model with state variables of the circuit design to generate the first abstract model; and
   computing the lower-bound-distance for the first abstract model.

17. The apparatus of claim 16, wherein the LBD computation engine is configured to compute the lower-bound-distance for the first abstract model using at least one of: a binary decision diagram (BDD); a Boolean satisfiability (SAT) solver; and an automatic test pattern generator (ATPG).

18. The apparatus of claim 13, wherein the LBD computation engine is operated concurrently with the verification engine.

* * * * *